United States Patent

Nerone

[11] Patent Number: 5,929,520
[45] Date of Patent: Jul. 27, 1999

[54] CIRCUIT WITH SMALL PACKAGE FOR MOSFETS

[75] Inventor: Louis R. Nerone, Brecksville, Ohio

[73] Assignee: General Electric Company, Schenectady, N.Y.

[21] Appl. No.: 09/038,260

[22] Filed: Mar. 10, 1998

[51] Int. Cl.⁶ .......................... H01L 23/34; H01L 23/52; H01L 23/82
[52] U.S. Cl. ...................... 257/724; 257/678; 257/723; 257/691
[58] Field of Search .................................. 257/678, 723, 257/691, 724

[56] References Cited

U.S. PATENT DOCUMENTS

| | | |
|---|---|---|
| 5,489,804 | 2/1996 | Pasch . |
| 5,585,600 | 12/1996 | Froebel et al. . |
| 5,585,668 | 12/1996 | Burns . |
| 5,598,031 | 1/1997 | Groover et al. . |
| 5,629,542 | 5/1997 | Sakamoto et al. ...................... 257/328 |
| 5,637,913 | 6/1997 | Kajihara et al. . |
| 5,646,829 | 7/1997 | Sota . |
| 5,648,683 | 7/1997 | Takahashi ............................... 257/685 |
| 5,814,884 | 9/1998 | Davis et al. ............................. 257/723 |
| 5,821,618 | 10/1998 | Graf et al. ............................... 257/723 |

OTHER PUBLICATIONS (Anonynous), "Little Foot Surface–Mount Power Mosfets Featured Products," Siliconix Inc., Santa Clara, California, Feb. 1997, title page, pp. iv, v, 5–10 and 5–11.

Nerone, "Acknowledgement of Background Art," Louis R. Nerone (applicant).

*Primary Examiner*—Teresa M. Arroyo
*Attorney, Agent, or Firm*—Charles E. Bruzga

[57] ABSTRACT

A circuit with a small package for MOSFETs comprises a load circuit in which an a.c. current flows. Further included are a p-channel enhancement-mode MOSFET and an n-channel enhancement-mode MOSFET, the sources of which are connected together at a common node through which the a.c. current flows. The MOSFETs respectively provide positive-going and negative-going contributions to the a.c. current, with approximately equal r.m.s. values. A package is provided in which the MOSFETs are arranged adjacent to each other, in the same plane. A main surface of the package has an area of no more than about 40.5 square millimeters. The channel area of the p-channel MOSFET is from about 1.4 to about 2.0 times the channel area of the n-channel MOSFET.

15 Claims, 2 Drawing Sheets

CIRCUIT WITH SMALL PACKAGE FOR MOSFETS

FIELD OF THE INVENTION

The present invention relates to circuits including a p-channel enhancement mode MOSFET and an n-channel enhancement mode MOSFET, which each carry substantially the same root mean square (r.m.s.) currents. More particularly, it relates to such a circuit employing a small package for the MOSFETs.

BACKGROUND OF THE INVENTION

Electronic circuits, such as ballast circuits for gas discharge lamps, typically employ a p-channel enhancement mode MOSFET and an n-channel enhancement mode MOSFET, each carrying substantially the same r.m.s. currents. Certain lamp applications require a physical small ballast circuit, such as a compact fluorescent lamp using an Edison-type screw base. Typical circuits employ separate packages for the two MOSFETs, which adds to circuit size. It would, therefore, be desirable to package both MOSFETs in the same, small package, while maintaining the temperature rise of each MOSFET approximately the same. In this way, the MOSFETs will have similar lifetimes.

SUMMARY OF THE INVENTION

An exemplary embodiment of the invention provides a circuit with a small package for MOSFETs. The circuit comprises a load circuit in which an a.c. current flows. Further included are a p-channel enhancement-mode MOSFET and an n-channel enhancement-mode MOSFET, the sources of which are connected together at a common node through which the a.c. current flows. The MOSFETs respectively provide positive-going and negative-going contributions to the a.c. current, with approximately equal r.m.s. values. A package is provided in which the MOSFETs are arranged adjacent to each other, in the same plane. A main surface of the package has an area of no more than about 40.5 square millimeters. The channel area of the p-channel MOSFET is from about 1.4 to about 2.0 times the channel area of the n-channel MOSFET.

The foregoing circuit realizes a small package for both MOSFETs, whose dimensions are selected to approximately equal temperature rises between the MOSFETs. Beneficially, the package can be inexpensively constructed such that the only metallic thermal cooling paths away from said MOSFETs in said package comprise a lead frame.

DETAILED DESCRIPTION OF THE INVENTION

Figure 1:
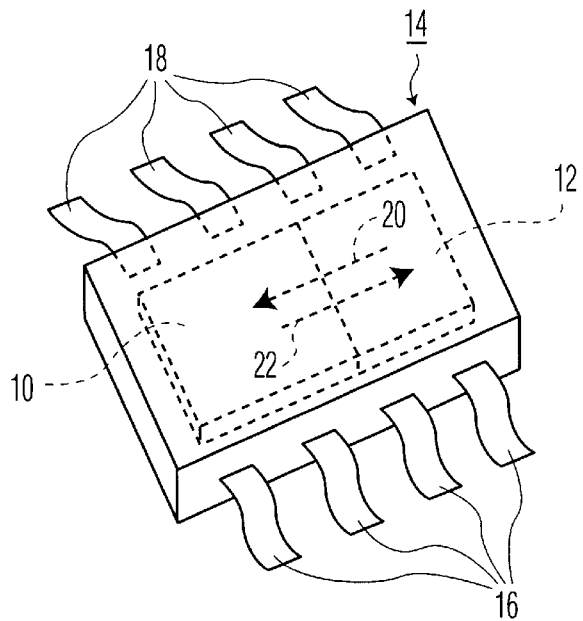
FIG. 1 is a simplified perspective view of a pair of MOSFETs mounted in a semiconductor package.

FIG. 1 shows a p-channel, enhancement-mode MOSFET 10 packaged adjacent to a smaller, n-channel enhancement-mode MOSFET 12 in a so-called Small Outline Dual In-Line package 14. Package 14 may have four leads 16 extending from one side, and four leads 18 extending from another side, although the number of leads may vary. As will be detailed below, MOSFETs 12 and 14 carry substantially equal root mean square (r.m.s.) current levels. To minimize the size of the package, thermal cooling path 20 from MOSFET 12 to MOSFET 10, shown as a single arrow for convenience, and thermal cooling path 22 from MOSFET 10 to MOSFET 12, shown as a single arrow, should be reduced to a small, and preferably, negligible level compared with remaining thermal cooling paths from the MOSFETs, such as shown at 19 in FIG. 2. Beneficially, package 14 can be economically made such that the only metallic thermal cooling paths comprise a lead frame 17, shown in simplified form, connected to leads 16 and 18.

The foregoing thermal condition can be expressed as follows:

$$\theta p \times Pp = \theta n \times Pn, \qquad (\text{eq. 1})$$

where:

$\theta p$ is the thermal resistance of the aggregate cooling paths (not shown) away from p-channel MOSFET 10;

$\theta n$ is the thermal resistance of the aggregate cooling paths (not shown) away from n-channel MOSFET 12; and Pp and Pn are the respective power dissipations within MOSFETs 10 and 12.

Figure 3:
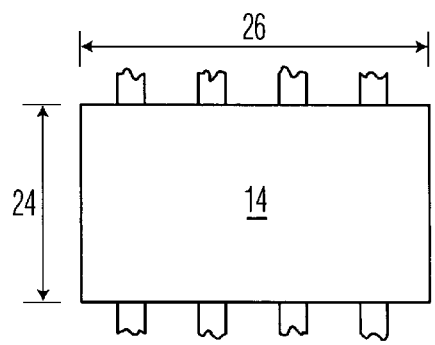
FIG. 3 is a simplified top plan view of the package of FIG. 1

The foregoing thermal issue is particularly significant where package 14 has a small aggregate main area. FIG. 3 illustrates such "main area," as this term is used in this specification and claims. In such figure, the main area, which is the product of dimensions 24 and 26 in the embodiment shown, is preferably no more than about 40.5 square millimeters; more preferably no more than about 35.4 square millimeters; and still more preferably no more than about 20.2 square millimeters.

Alternatively, the subject thermal issue is particularly significant where the maximum power rating for MOSFETs 10 and 12 collectively is no more than about 1 watt; and, more preferably, no more than about ½ watt.

With significantly larger MOSFETs, inter-device thermal transfer is reduced compared with increased thermal transfer through the device package (e.g.. lead frame).

Figure 4:
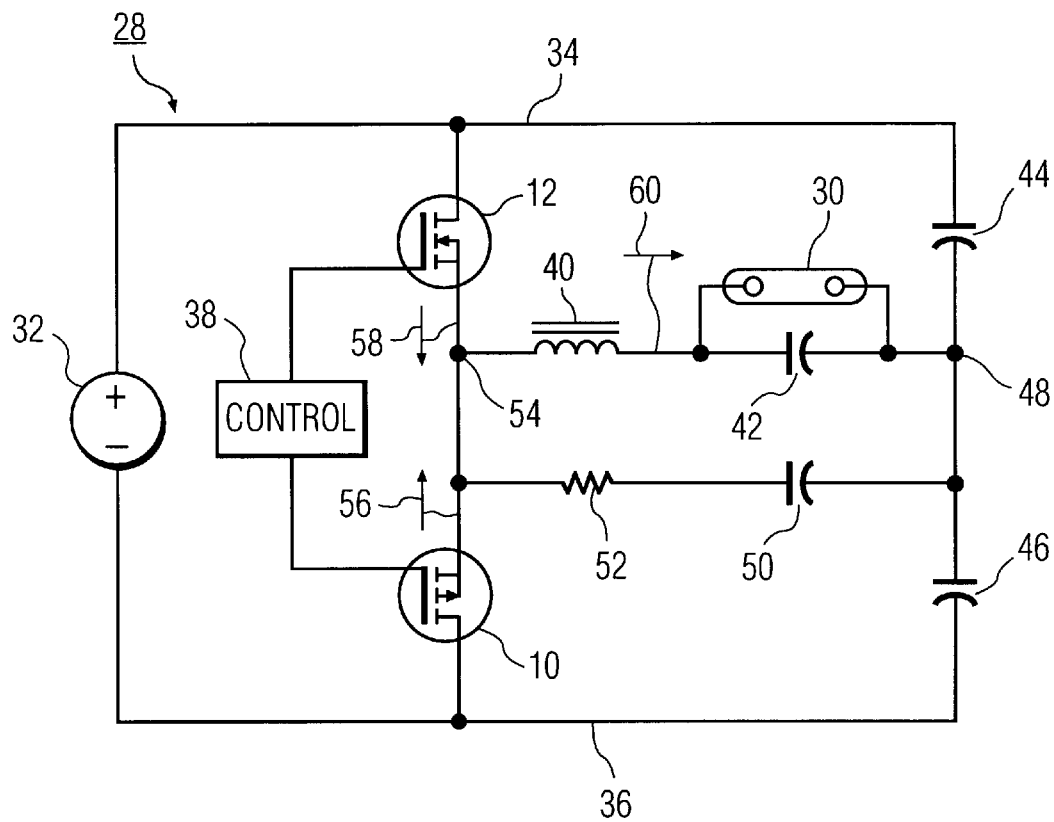
FIG. 4 is a schematic diagram of a typical circuit employing the MOSFETs of FIG. 1.

FIG. 4 shows a ballast circuit 28 for a compact fluorescent lamp 30 employing MOSFETs 10 and 12. A d.c. voltage source 32 provides a d.c. voltage between a bus conductor 34 and a reference conductor 36. A circuit 38 controls alternate conduction of MOSFETs 10 and 12, usually in response to feedback from a resonant load circuit including lamp 30, a resonant inductor 40 and a resonant capacitor 42. Capacitors 44 and 46 maintain the potential of node 48 at about ½ the voltage between bus and reference conductors 34 and 36. An optional snubber circuit may be formed from capacitor 50 and, optionally, a resistor 52, as further described in U.S. Pat. No. 5,382,882, commonly assigned.

In operation, MOSFET 10 conducts and shorts common node 54 to reference conductor 36. This creates a current 56 which is negative-going with respect to the direction of arrow 56. MOSFET 10 then switches off and MOSFET 12 conducts, connecting node 54 to bus conductor 34. This creates a positive-going current 58 with respect to the direction of arrow 58. Currents 56 and 58 combine at node 54 to form resonant load current 60. The r.m.s. values of currents 56 and 58 are approximately the same in the ballast circuit of FIG. 4.

Figure 5:
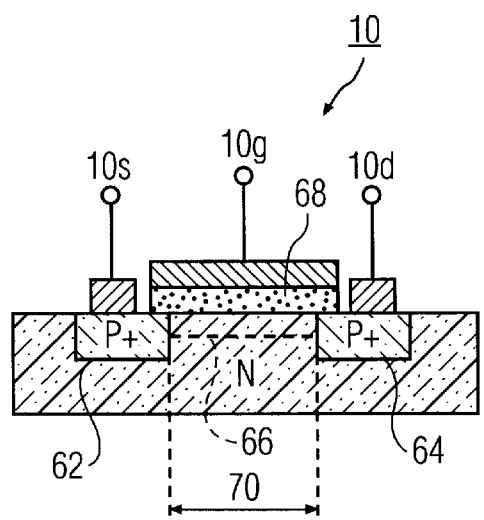
FIG. 5 is a cross-sectional view of p-channel MOSFET 10 of FIG. 1.

To approach the condition of equation 1 above, one consideration is to equalize the respective on-resistances of MOSFETs 10 and 12 by taking into account the difference in the mobility of charge carriers in their channels. FIG. 5 shows a cross section of p-channel enhancement-mode MOSFET 10. As shown, source 10s and drain 10d electrodes are connected to highly doped p-conductivity regions 62 and 64. A gate 10g is separated from inversion channel 66 by an oxide or other electrically insulating layer 68. When suitably biased with respect to source 10s, gate 10g creates inversion channel of p-conductivity type. The width of the channel, as used herein, is shown by dimension 70, i.e., the separation between regions 62 and 64.

With the mobility of the p-channel of MOSFET 10 being approximately half that of the n-channel of MOSFET 12, and with the same channel widths by way of example, a scaling of the area of the p-channel to approximately twice that of the n-channel would tend to equalize the on-resistances of MOSFETs 10 and 12.

Figure 2:
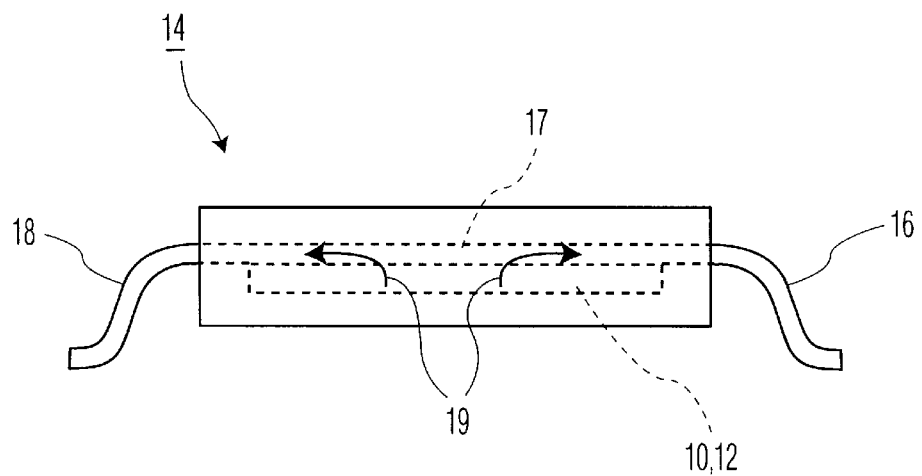
FIG. 2 is a simplified end view of the semiconductor package of FIG. 1.

However, in the small size and power range discussed above, doubling the p-channel area, for instance, increases the surface area of MOSFET 10 available for cooling in thermal paths 19 (FIG. 2). Therefore, such MOSFET would not run as hot as n-channel MOSFET 12. Accordingly, the increase in area of the p-channel should account for the greater thermal cooling that results.

The range of ratios of channel area of p-channel MOSFET 10 to channel area of n-channel MOSFET 12 should be between about 1.4 and about 2.0; and, more preferably, between about 1.4 and about 1.6.

While the invention has been described with respect to specific embodiments by way of illustration, many modifications and changes will occur to those skilled in the art. For instance, although lamp 12 (FIGS. 1 and 8) may have cathodes, it could alternatively be an electrodeless lamp. It is therefore, to be understood that the appended claims are intended to cover all such modifications and changes as fall within the true spirit and scope of the invention.

What is claimed is:

1. A circuit with a small package for MOSFETs, comprising:
   (a) a load circuit in which an a.c. current flows;
   (b) a p-channel enhancement-mode MOSFET and an n-channel enhancement-mode MOSFET whose sources are connected together at a common node, through which said a.c. current flows;
   (c) said MOSFETs respectively providing positive-going and negative-going contributions to said a.c. current, with approximately equal r.m.s. values;
   (d) a package in which said MOSFETs are arranged adjacent to each other, in the same plane; a main surface of said package having an area of no more than about 40.5 square millimeters; and
   (e) the channel area of said p-channel MOSFET being from about 1.4 to about 2.0 times the channel area of said n-channel MOSFET.

2. The circuit of claim 1, wherein the channel area of said p-channel MOSFET is from about 1.4 to about 1.6 times the channel area of said n-channel MOSFET.

3. The circuit of claim 1, wherein channel areas of said MOSFETs are selected to approximately equalize respective temperature rises of said MOSFETs during normal operation.

4. The circuit of claim 1, wherein said area of said package is no more than about 20.2 square millimeters.

5. The circuit of claim 1, wherein said package is arranged such that the only metallic thermal cooling paths away from said MOSFETs in said package comprise a lead frame.

6. The circuit of claim 5, wherein said package is a Small Outline Dual In-Line package.

7. The circuit of claim 1, wherein channel areas of said MOSFETs are selected to make thermal cooling paths between MOSFETs negligible compared with remaining thermal cooling paths from said MOSFETs.

8. A circuit with a small package for MOSFETs, comprising:
   (a) a load circuit in which an a.c. current flows;
   (b) a p-channel enhancement-mode MOSFET and an n-channel enhancement-mode MOSFET whose sources are connected together at a common anode, through which said a.c. current flows;
   (c) said MOSFETs respectively providing positive-going and negative-going contributions to said a.c. current, with approximately equal r.m.s. values;
   (d) a package in which said MOSFETs are arranged adjacent to each other, in the same plane; a main surface of said package having an area of no more than about 40.5 square millimeters; and
   (e) the power rating for said MOSFETs collectively is no more than about 1 watt.

9. The circuit of claim 8, wherein the power rating for said MOSFETs collectively is no more than about ½ watt.

10. The circuit of claim 8, wherein the channel area of said p-channel MOSFET is from about 1.4 to about 2.0 times the channel area of said n-channel MOSFET.

11. The circuit of claim 8, wherein channel areas of said MOSFETs are selected to approximately equalize respective temperature rises of said MOSFETs during normal operation.

12. The circuit of claim 8, wherein said area of said package is no more than about 20.2 square millimeters.

13. The circuit of claim 8, wherein said package is arranged such that the only metallic thermal cooling paths away from said MOSFETs in said package comprise a lead frame.

14. The circuit of claim 13, wherein said package is a Small Outline Dual In-Line package.

15. The circuit of claim 8, wherein channel areas of said MOSFETs are selected to make thermal cooling paths between MOSFETs negligible compared with remaining thermal cooling paths from said MOSFETs.

* * * * *